(12) United States Patent
Hatanaka et al.

(10) Patent No.: US 8,436,760 B1
(45) Date of Patent: May 7, 2013

(54) LOW POWER CURRENT-VOLTAGE MIXED ADC ARCHITECTURE

(75) Inventors: Shingo Hatanaka, San Jose, CA (US);
Shafiq M. Jamal, Gilroy, CA (US);
Hung Sheng Lin, San Jose, CA (US);
Ovidiu Carnu, San Francisco, CA (US)

(73) Assignee: Marvell International Ltd., Hamilton (BM)

( * ) Notice: Subject to any disclaimer, the term of this patent is extended or adjusted under 35 U.S.C. 154(b) by 76 days.

(21) Appl. No.: 12/882,496

(22) Filed: Sep. 15, 2010

Related U.S. Application Data

(60) Provisional application No. 61/245,985, filed on Sep. 25, 2009.

(51) Int. Cl.
*H03M 1/38* (2006.01)
(52) U.S. Cl.
USPC ........... 341/161; 341/118; 341/122; 341/155; 341/156
(58) Field of Classification Search .......... 341/118–122, 341/155, 156, 161
See application file for complete search history.

(56) References Cited

U.S. PATENT DOCUMENTS

| | | | | |
|---|---|---|---|---|
| 4,331,892 A | * | 5/1982 | Miskin et al. | 341/136 |
| 5,070,332 A | * | 12/1991 | Kaller et al. | 341/156 |
| 5,117,227 A | * | 5/1992 | Goeke | 341/166 |
| 5,990,820 A | * | 11/1999 | Tan | 341/161 |
| 6,127,958 A | * | 10/2000 | Chang et al. | 341/155 |
| 6,462,695 B1 | * | 10/2002 | Ahuja et al. | 341/161 |
| 7,164,379 B1 | * | 1/2007 | Rao | 341/161 |
| 7,183,962 B1 | * | 2/2007 | Roo et al. | 341/155 |
| 7,205,923 B1 | * | 4/2007 | Bahai | 341/161 |
| 2007/0096973 A1 | * | 5/2007 | Sutardja | 341/161 |
| 2009/0073016 A1 | * | 3/2009 | Fattaruso et al. | 341/155 |

OTHER PUBLICATIONS

Elen 689-603, "Pipeline ADC's", Feb. 2000, to be published by the USPTO, 29 pages.
Li, Yingxuan, "Data Converter with Redundancy for Error Correction in Polarity Decision", U.S. Appl. No. 12/569,060, filed Sep. 29, 2009, to be published by the USPTO, 42 pages.
Verbruggen et al. "A 2.2mW 5b 1.75GS/s Folding Flash ADS in 90nm Digital CMOS," IEEE International Solid-State Circuits Conference, ISBN: 978-1-4244-2011-7, 252-253 and 611 (2008), 3 pages.

* cited by examiner

*Primary Examiner* — Linh Nguyen

(57) ABSTRACT

The present disclosure includes systems and techniques relating to low power current-voltage mixed ADC architecture. In some implementations, an apparatus includes sample and hold circuitry, at least one ADC module configured to generate a first digital output based on a first analog input provided to the sample and hold circuitry, and current generation circuitry configured to modulate an analog output of the sample and hold circuitry to generate a residue output corresponding to the first analog input absent at least a portion corresponding to the first digital output, and to provide the residue output as a second analog input to further circuitry to generate a second digital output.

20 Claims, 19 Drawing Sheets

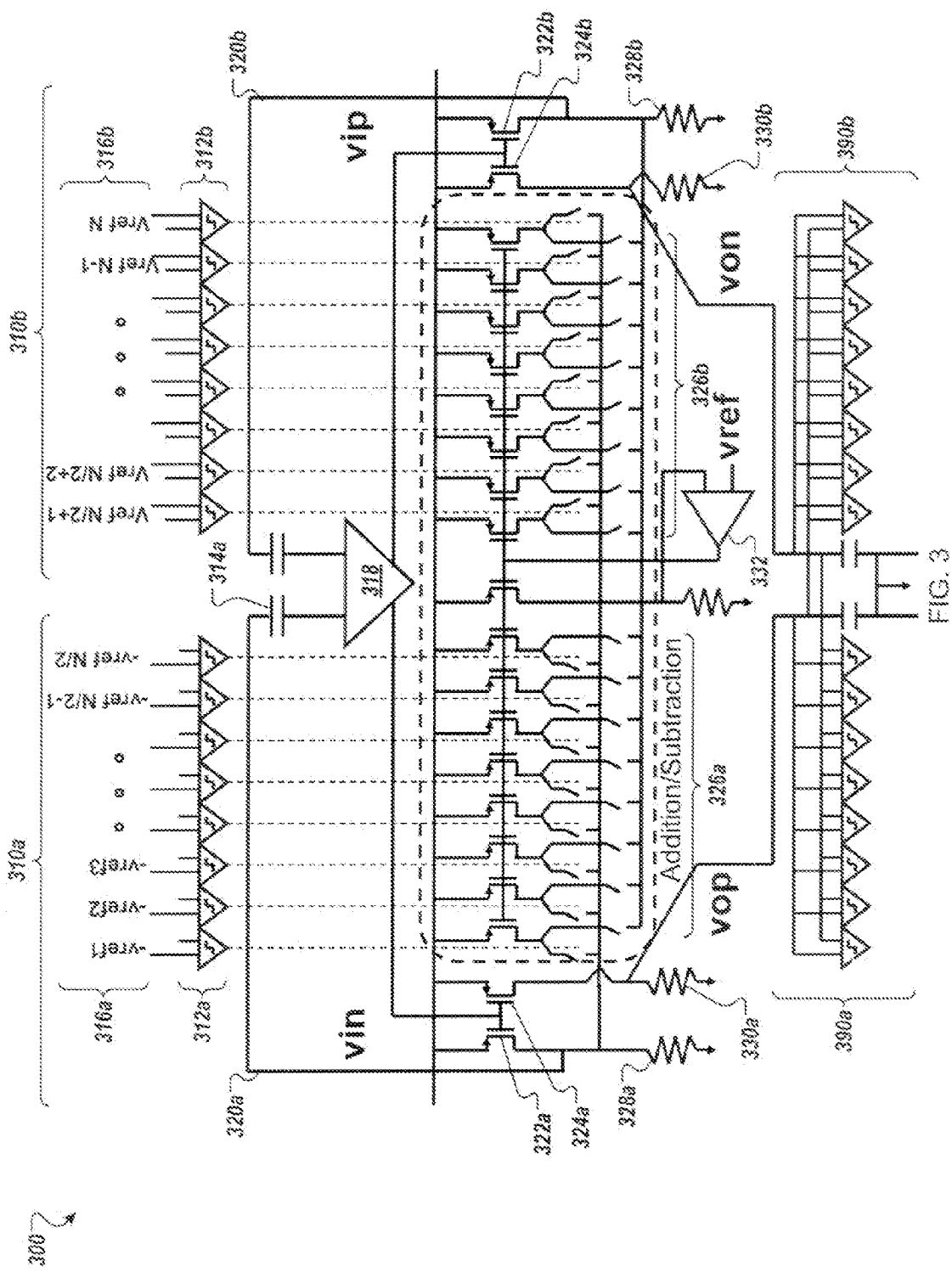

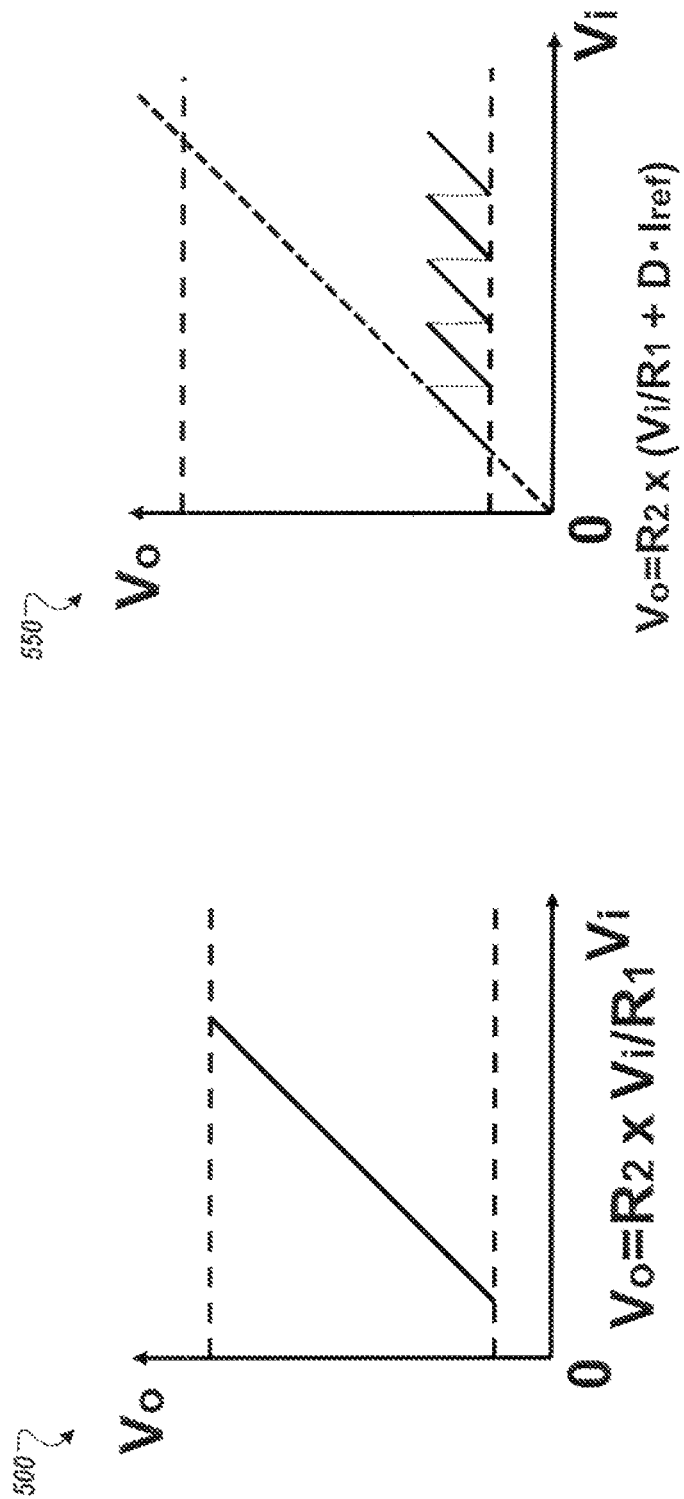

LOW POWER CURRENT-VOLTAGE MIXED ADC ARCHITECTURE

CROSS REFERENCE TO RELATED APPLICATIONS

This application claims the benefit of the priority of U.S. Provisional Application Ser. No. 61/245,985, filed Sep. 25, 2009 and entitled "LOW POWER CURRENT-VOLTAGE MIXED ADC ARCHITECTURE", the disclosure of which is incorporated by reference in its entirety.

BACKGROUND

The present disclosure describes systems and techniques relating to analog to digital converter (ADC) circuitry, such as pipelined ADC circuitry.

The pipelined ADC has become a popular ADC architecture for sampling rates from a few megasamples per second (Msps) up to 100 Msps or greater. Resolutions generally range from a few bits at the faster sample rates up to 16 bits at lower rates. These resolutions and sampling rates cover a wide range of applications, including charge coupled device (CCD) imaging, ultrasonic medical imaging, digital receivers, base stations, digital video (for example, high definition television, HDTV), digital subscriber, lines (DSL), cable modems, and fast Ethernet.

FIG. 1 illustrates a schematic of prior art pipelined ADC circuitry 100. The circuitry 100 operates in two phases, a sample phase 110 wherein an input voltage (Vin) 125 is provided to the circuit, and a hold phase 120 wherein the input voltage 125 is compared to a number of reference voltages 130 to determine a residual voltage output 135 that is a portion of the input voltage 125.

During the sample phase 110, the input voltage 125 is provided to and stored across a collection of sampling capacitors 140 that are arranged in parallel. A capacitor 145 is reset in sample phase 110. The input voltage 125 is also stored on a feedback capacitor 145, which is also used as a sampling capacitor during the hold phase (e.g., to reduce the amount of area needed for the sampling capacitors).

Referring now to the hold phase 120, the input voltage 125 (now stored by the feedback capacitor 145) is compared by an opamp 150 to a collection of reference voltages applied to the sampling capacitors 140 to determine a residual voltage output 135 that presents an output voltage Vout that is substantially the input voltage 125 with the reference voltage added or subtracted from it.

Bandwidth is determined for a given sampling frequency, and for high accuracy an increased number of sampling capacitors 140 are generally needed. But as the number of sampling capacitors in the circuitry 100 is increased, the feedback factor decreases. One approach to this problem is to implement multiple opamps 150. But as the number of sampling capacitors 140 and opamps 150 increases, so too does the device size as well as the device's power requirements.

SUMMARY

The present disclosure includes systems and techniques relating to a low power current-voltage mixed ADC architecture. According to an aspect of the described systems and techniques, an analog to digital converter (ADC) device includes sample and hold circuitry, at least one ADC module configured to generate a first digital output based on a first analog input provided to the sample and hold circuitry, and current generation circuitry configured to modulate an analog output of the sample and hold circuitry to generate a residue output corresponding to the first analog input absent at least a portion corresponding to the first digital output, and to provide the residue output as a second analog input to further circuitry to generate a second digital output. In some implementations, the current generation circuitry can include a current source, a current mirror coupled with the current source, and a current source array coupled in parallel with the current source or the current mirror. In some implementations, the ADC device can be coupled to a system that includes a processor, and the sample and hold circuitry can be configured to sample and hold the first analog input to be converted.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

For example the disclosed embodiment(s) below can be implemented in various systems and apparatus, including, but not limited to, a special purpose data processing apparatus (e.g., a wireless access point, a remote environment monitor, a router, a switch, a computer system component, a medium access unit), a mobile data processing apparatus (e.g., a wireless client, a cellular telephone, a personal digital assistant (PDA), a mobile computer, a digital camera), a general purpose data processing apparatus (e.g., a minicomputer, a server, a mainframe, a supercomputer), or combinations of these.

Thus, according to another aspect of the described systems and techniques, a method can include receiving a voltage input from an operational amplifier, the operational amplifier being in a main loop of sample and hold circuitry having an associated analog to digital converter (ADC) module, adding or subtracting, outside of the main loop, current with respect to an output of the main loop to modulate the voltage input from the operational amplifier, in accordance with a residue function, to generate a voltage output, and providing the voltage output to further circuitry to generate a digital output corresponding to the voltage output.

The described systems and techniques can result in an ADC device with increased bandwidth and/or accuracy that is smaller and more power efficient than comparable circuits that use existing ADC architectures. To avoid the inefficiency due to the increase in the number of capacitors normally associated with ADC circuits, addition and subtraction of output voltage is pushed out of the opamp loop, and this configuration can exhibit an improvement in bandwidth losses due to the poor feedback factor caused by the use of many capacitors. Recent sub-micron processes may be taken advantage of to achieve high matching accuracy between a feedback capacitor and a MOS device, while shrinking the overall size of the ADC when compared to more conventional architectures. Input capacitor size can be reduced as noise allows, which can provide a substantial power savings for ADC drivers. This design can reduce the amount of power required for operation of the ADC and also for the front end driver used to charge up the input capacitor of the ADC.

Details of one or more implementations are set forth in the accompanying drawings and the description below. Other features, objects and advantages may be apparent from the description and drawings, and from the claims.

DRAWING DESCRIPTIONS

FIG. 3 shows a schematic of an example of a low power current-voltage mixed ADC circuit.

FIGS. 5A and 5B show graphs of transfer functions.

Like reference symbols in the various drawings indicate like elements.

DETAILED DESCRIPTION

The systems and techniques described herein can be implemented as one or more devices, such as one or more integrated circuit (IC) devices, in analog to digital converter devices (e.g., data acquisition cards) or embedded into audio, video, or other signal processing products (e.g., a wireless communication device, a digital microphone, an analog video game controller, a digital camera).

Figure 1:
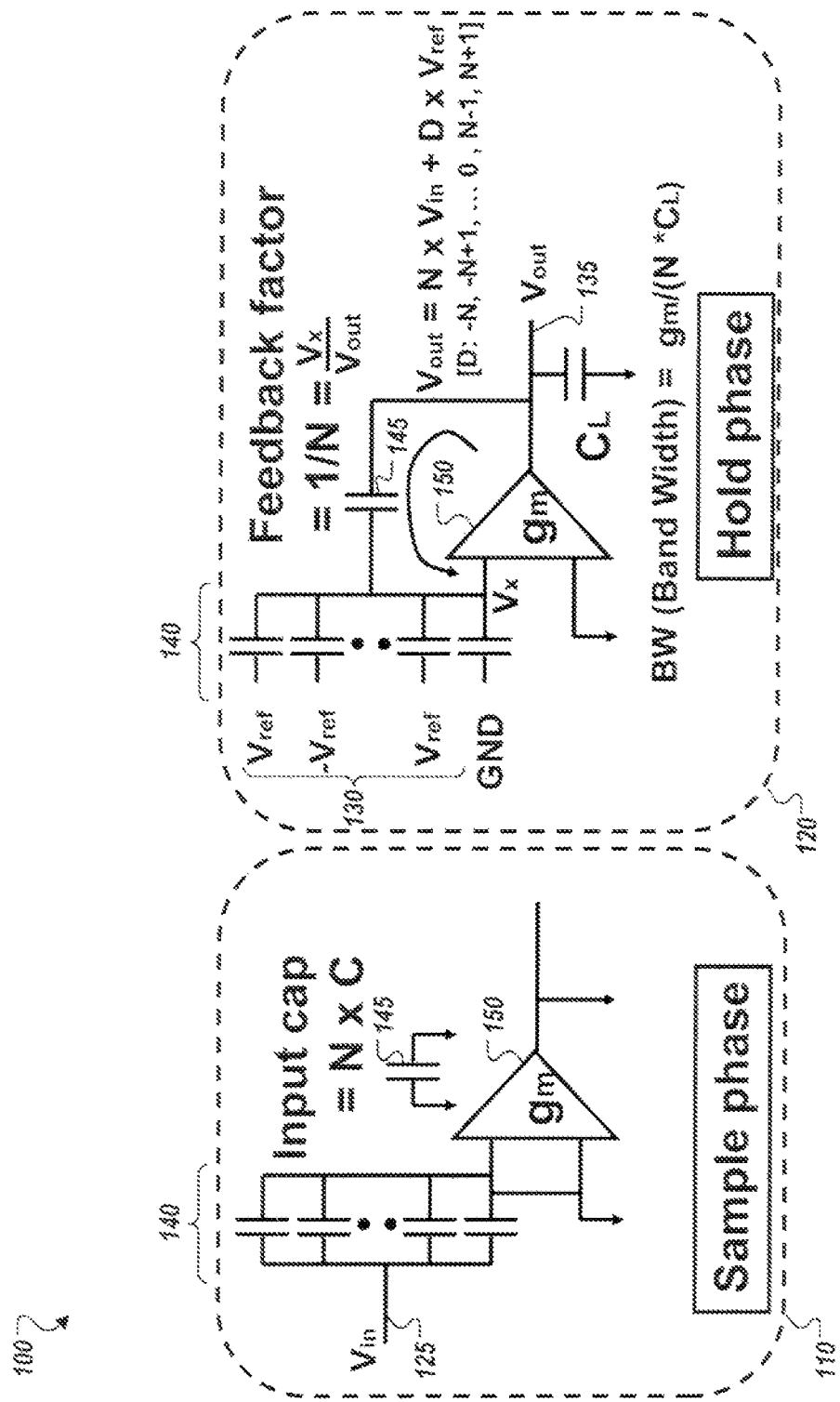
FIG. 1 illustrates a schematic of a prior art ADC circuit.
Figure 2A:
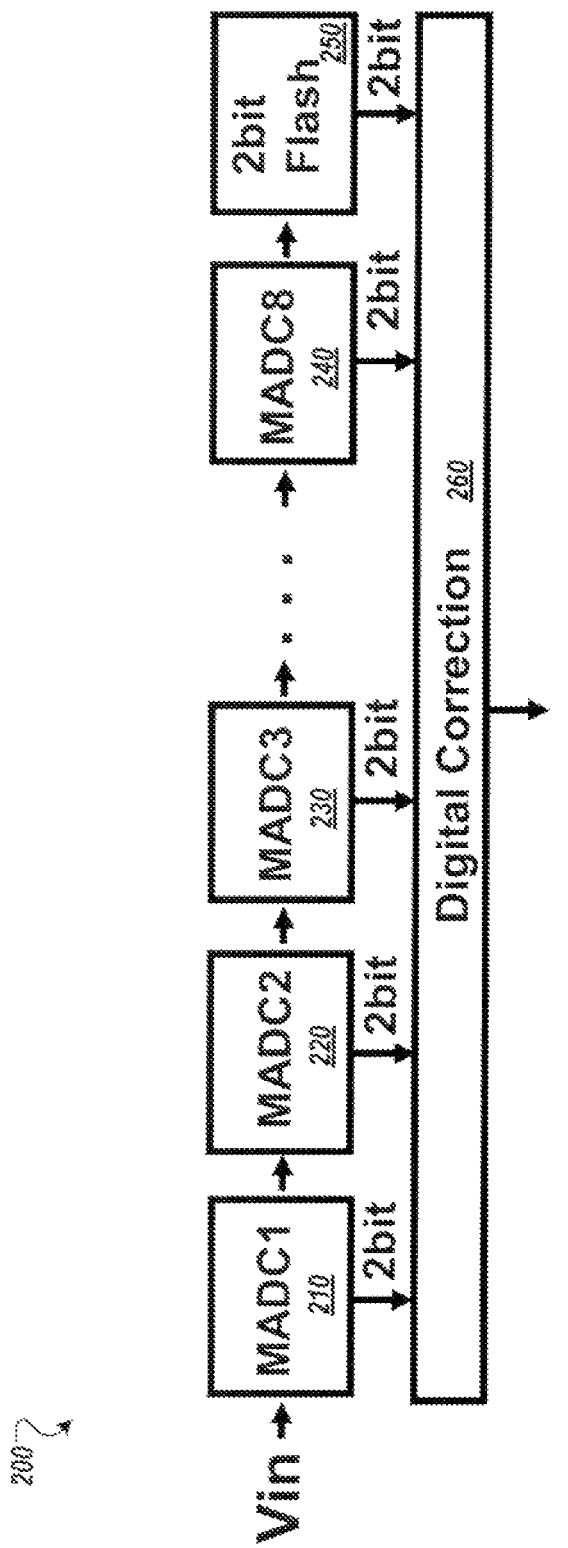
FIG. 2A shows a block diagram of an example of a pipelined ADC architecture.

FIG. 2A shows a block diagram of an example of a pipelined ADC architecture 200. In the present example, an input voltage Vin is supplied to a chain of multiplying analog to digital converter (MDAC) modules 210-240. In general, each of the MDAC modules 210-240 receives an analog input voltage, compares the input voltage to at least one reference voltage to determine a digital output, and outputs the result of that comparison as a 2-bit digital output. Although 2-bit MADCs are described in this example, any appropriate number of MADCs, each outputting any appropriate number of bits, may be implemented. Each of the MADC modules 210-240 also offsets their input voltage by the referenced amount, and provides the offset voltage to a subsequent MADC module as an input voltage. In such an arrangement, each successive MADC module 210-240 in the chain performs an incrementally more precise comparison of the input voltage Vin.

At the end of the chain is a 2-bit flash ADC module 250. In some implementations, the 2-bit flash ADC module 250 may be more economical to implement than an MADC module for determining the least significant bit(s) of the analog to digital conversion.

The 2-bit outputs of the MADC modules 210-240 and the 2-bit ADC module 250 are provided to an error correction module 260. In some implementations, the error correction module 260 may decode the digital outputs of the modules 210-250 to produce a digital value that represents the input voltage. In some implementations, the error correction module 260 may identify errors in the digital outputs of the module 210-250. For example, the use of two bits per stage provides a degree of overlap between the outputs of the modules 210-250, and any inconsistencies between the digital outputs of adjacent pairs of the modules 210-250 may be identified and corrected by the error correction module 260 before the digital representation of the input voltage is output.

Figure 2B:
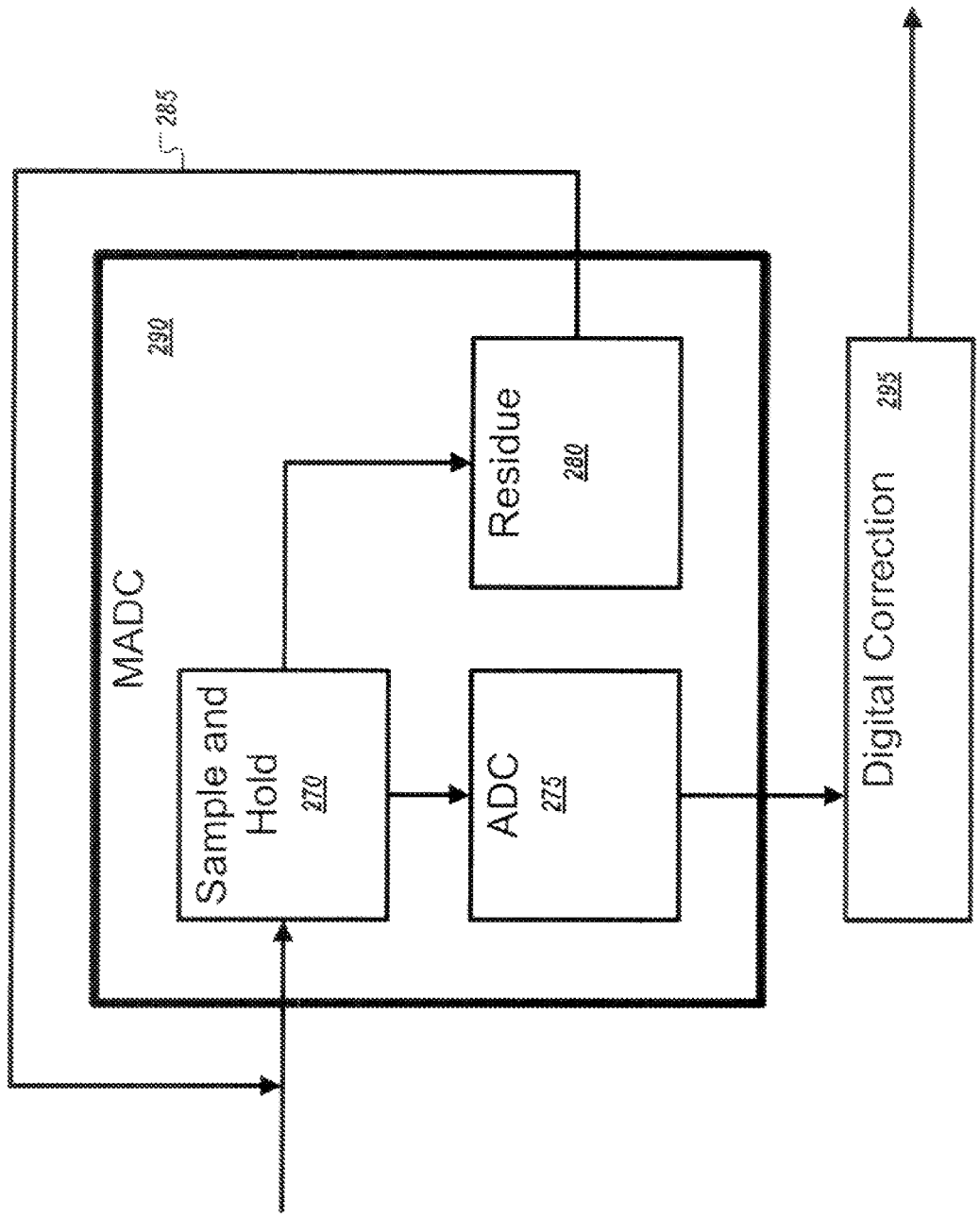
FIG. 2B shows a block diagram of another example of a pipelined ADC architecture.

FIG. 2B shows a block diagram of another example of a pipelined ADC architecture. In this example, the pipelining is temporal rather than spatial in that a single MADC module 290 is used to obtain each successively more precise digital conversion, i.e., the MADC module 290 determines the more significant bit(s) before providing the offset voltage back to itself for use in determining the less significant bits(s). The MADC module 290 includes sample and hold module (SAH) 270. The SAH 270 samples a received input voltage and maintains the sample of the input voltage while an ADC module 275 compares the held voltage to a collection of reference voltages (e.g., two per stage in a pipelined ADC). The ADC module 275 determines a digital output and provides the digital output to an error correction module 295.

Residue circuitry 280 offsets the input voltage with a voltage that is representative of the MADC module stage (e.g., adds or subtracts a voltage, to or from the input voltage), and amplifies the offset voltage. The residue circuitry 295 provides the offset voltage to a feedback signal line 285, which feeds the offset voltage back into the MADC module 290 as a new input voltage. Thus, a single MADC module can be used to determine the digital representation of the original input voltage by successively comparing components of the input voltage, wherein each successive iteration increases the resolution of the measurement by an additional amount (e.g., two bits per stage).

Various detailed examples of circuitry, which can be implemented in the pipelined ADC examples addressed above, are described below. However, it should be noted that the systems and techniques described below can be applied to multiple different ADC architectures, including successive approximation range (SAR) ADCs, and are not limited to pipelined ADCs.

FIG. 3 shows a schematic of an example of a low power current-voltage mixed ADC circuit 300. The ADC circuit 300 is a differential ADC circuit, having substantially mirrored sub circuits 310a and 310b. In some implementation, differential ADC circuits may be used to reject noise that may be injected into the input voltage path by unwanted external sources (e.g., electromagnetic interference). For the sake of simplifying this description, the differential half of the circuit 300 represented by the sub-circuit 310a will be described. It should be understood that similar components in the sub-circuit 310b perform substantially similar functions to those in the sub-circuit 310a.

In a sample phase, an input voltage Vin is supplied to a differential comparator array 312a and a sampling capacitor 314a. In a hold phase, the sampling capacitor 314a acts as a feedback capacitor to hold the input voltage Vin, while the differential comparator array 312a is supplied with a collection of reference voltages 316a.

A current source 322a, a current mirror 324a, and a current source array 326a are supplied by the output of an opamp 318. The current flowing through the current source 322a is limited by a resistor 328a, while the current that flows through the current mirror 324a is limited by a resistor 330a. In some implementations, the resistor 328a and the resistor 330a have substantially identical resistances. While the transistors in the present example are depicted as MOS devices, in some embodiments other devices and constructions may be used (e.g., bipolar devices).

In the hold phase, the opamp 318 holds a terminal 320a at a voltage substantially equal to Vin. The Vin provided to the input of the current source 322a and limited by the resistor 328a develops a limited current flow through the current source 322a. This current flow is mirrored by the current mirror 324a.

In implementations where the resistors 328a and 330a are matched, the current that flows through the current mirror 324a will be substantially identical to the current flowing through the current source 322a. Without the current source array 328a being active, the output voltage (Vop) developed across the resistor 330a will likewise be substantially identical to Vin.

The current source array 326a is powered by the output of an opamp 332. The reference current injected to the resistor 328a is generated based on reference voltage Vref, and is activated by the outputs of the comparator array 312a. For example, since the comparators in the comparator array 312a are each supplied with a different reference voltage, different members of the comparator array 312a will be active for different input voltage levels. Each comparator's output contributes to a digital output signal that is representative of the input voltage, and each active comparator activates a current flow through a corresponding one of the current sources in the current source array 326a. The activation of the various current sources in the current source array 326a has the effect of adding or subtracting from the total flow of output current, and therefore the output voltage Vop. The output voltage Vop, which has been modified by the current source array 326a, is then provided as an input voltage for a subsequent conversion stage's comparator array 390a. In some implementations, the output voltage Vop can be fed back to the comparator array 312a for a successive measurement using the circuit 300.

As mentioned previously, the sub-circuit 310b includes components 312b-390b that perform functions substantially similar to those of their corresponding components 312a-390a, but for a second signal of a differential pair of input voltage signals. In some implementations, the circuit 300 may operate as a single-ended ADC by providing the sub-circuit 300 with a reference voltage, a ground, or by modifying the circuit 300 to substantially omit the components 312b-390b.

In some implementations, the ADC circuit 300 can be a flash ADC, and the current source array 326a can include transistors coupled with and responsive to one or more output lines of the flash ADC. In some implementations, the current source array 326a can include multiple Metal Oxide Semiconductor (MOS) transistors. In some implementations, the inputs to the sub circuits 310a and 310b can be analog inputs that are each differential input signals.

Figure 4A:
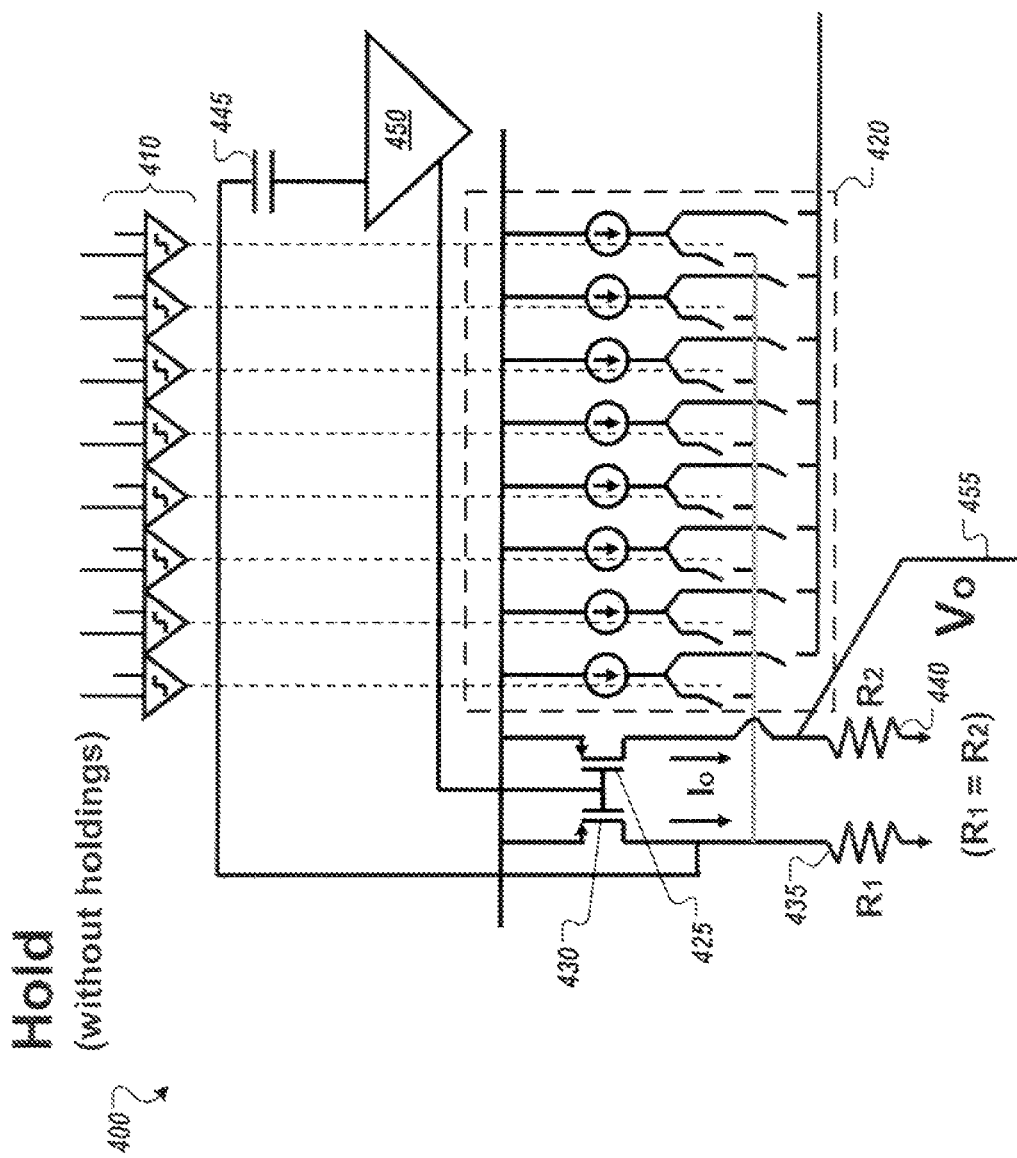
FIGS. 4A and 4B show a simplified hold phase schematic of an example of a low power current-voltage mixed ADC circuit.
Figure 4B:
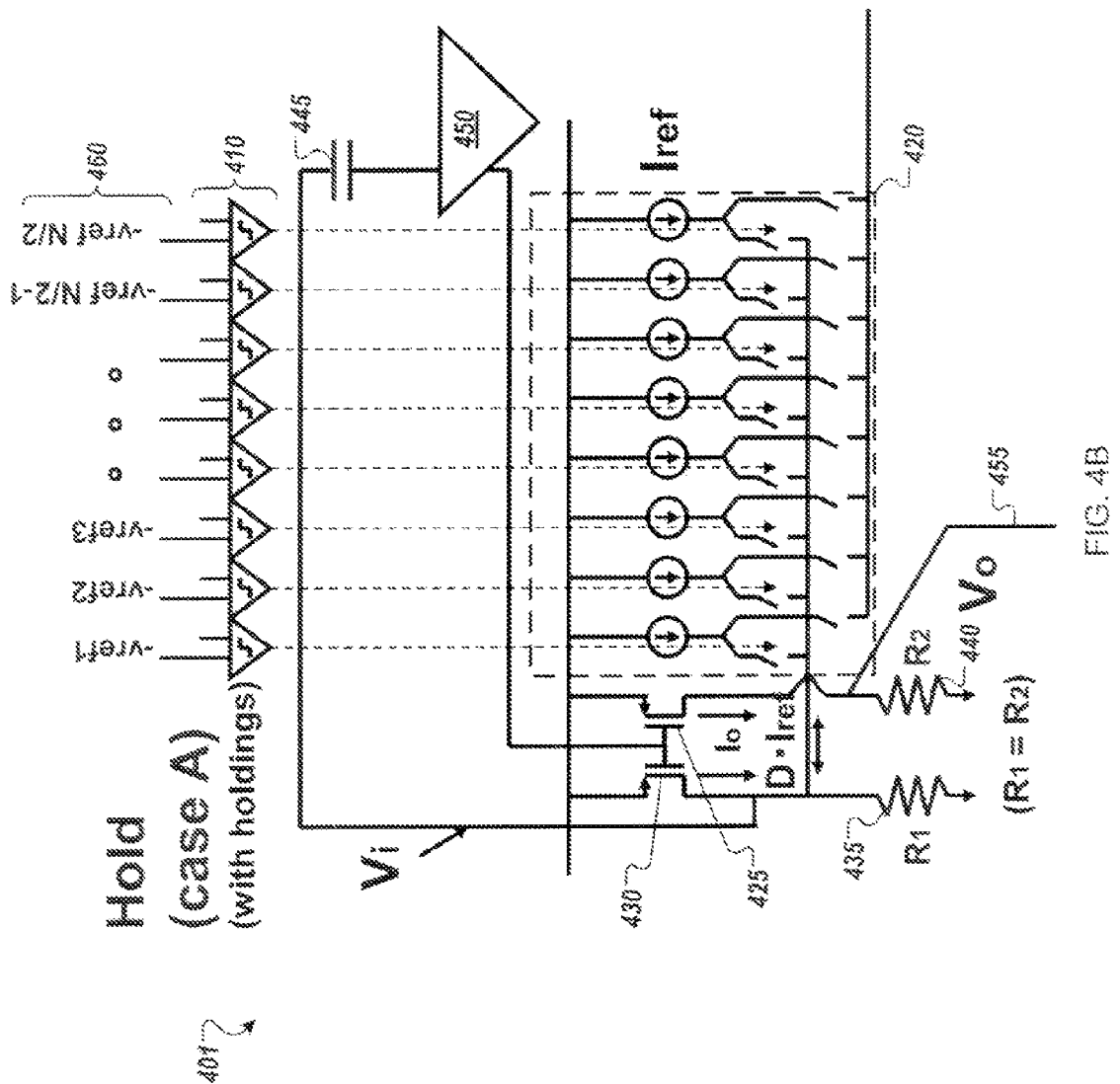

FIGS. 4A and 4B show a simplified hold phase schematic of an example low power current-voltage mixed ADC circuit. FIG. 4A shows the circuit 400 in a configuration with no holdings (e.g., reference voltages). While such a configuration is unlikely to be used in operation, it is described here to provide a theoretical baseline of operation which may help the reader better understand the operation of a similar circuit 401 as depicted in FIG. 4B. In the illustrated configuration, the circuit 400 is provided with an input voltage Vin, but none of the comparators in a comparator array 410 are active (e.g., the outputs the comparator array 410 are all zero). With none of the elements of the comparator array 410 active, none of the current sources in a current source array 420 will be switched in, therefore no currents will be added or subtracted from the output current Io flowing through a current mirror 425.

A resistor 435 limits the current flow through a current source 430, and a resistor 440 limits the current flow through the current mirror 425. Since in this example the resistor 435 and the resistor 440 have substantially equal resistances, and since the resistors 435, 440 are commonly supplied by an input voltage Vin that is held by a feedback capacitor 445 and driven by an opamp 450, the currents flowing through the current source 430 and the current mirror 425 will be equal. By extension, the output voltage Vo, provided at a voltage output 455, will match Vin. An example transfer function produced by such a theoretical configuration will be discussed in the description of FIG. 5A.

FIG. 4B shows a circuit 401 in a hold configuration with holdings. In some implementations, the circuit 401 can be the circuit 400, but with a collection of reference voltages 460 being provided to the comparator array 410. As various comparators in the comparator array 410 are activated in response to the input voltage Vin, so too are current sources in the current source array 420.

The currents provided by the current source array' 420 add or subtract current from the output current Io as it flows through the current source 430, which in turn, raises or lowers the output voltage Vo provided at the voltage output 455. An example transfer function produced by such a configuration will be discussed in the description of FIG. 5B.

Figure 4C:
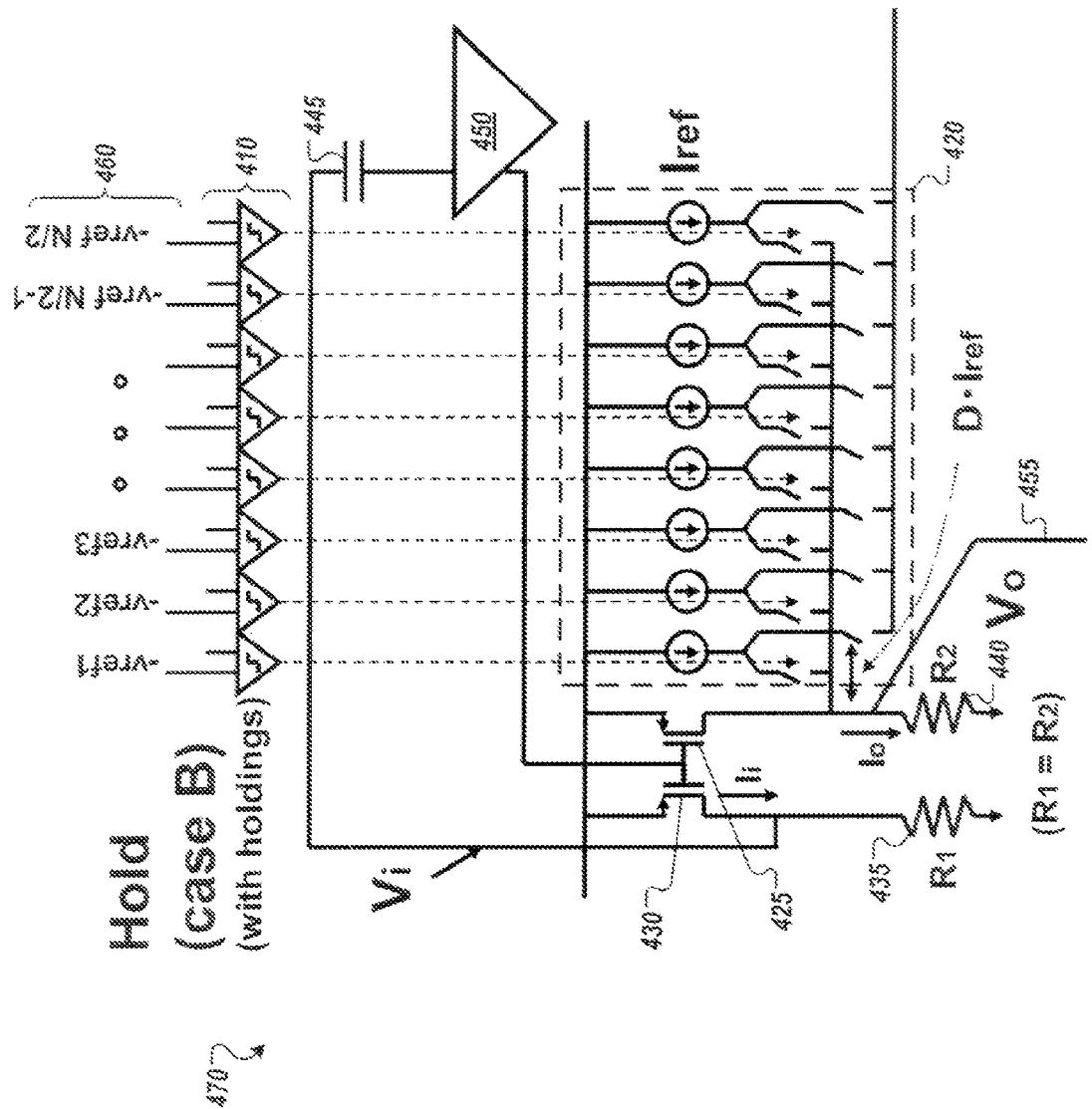
FIG. 4C shows a schematic of an alternative low power current-voltage mixed ADC circuit in a hold phase.

FIG. 4C shows a schematic of an example of a low power current-voltage mixed ADC circuit 470 in an alternative hold phase configuration. The circuit 470 is substantially similar to the circuit 401, except that the outputs of the current sources in the current array 420 are connected to the output of the current mirror 425 rather than the output of the current source 430.

As various comparators in the comparator array 410 are activated in response to the input voltage Vin, so too are current sources in the current source array 420. The currents provided by the current source array 420 add or subtract current from the output current Io as it flows through the current mirror 425, which in turn, raises or lowers the output voltage Vo provided at the voltage output 455.

FIGS. 5A and 5B show graphs of example transfer functions. FIG. 5A shows a graph of a theoretical example of a transfer function 500 that would be produced, for example, by the circuit 400 as depicted in FIG. 4A. The transfer function 500 is an example of the output voltage Vo in response to the input voltage Vin. Vo tracks Vin directly, for example, because the current sources in the current source array 420 are not being activated to add or subtract current, and therefore-voltage, from the output voltage Vo.

FIG. 5B shows a graph of an example of a transfer function 550 produced, for example, by the circuit 401 as depicted in FIG. 4B, or by the circuit 470 depicted in FIG. 4C. The transfer function 550 is an example of the output voltage Vo in response to the input voltage Vin.

The transfer function 550 is depicted as having an output voltage Vo that follows a sawtooth pattern as the input voltage Vin rises. The sawtooth pattern is a result of the activation of various current sources in the current source array 420. As Vin rises, additional comparators in the comparator array 410 activate additional current sources in the current source array 420. The additional current sources, in this example, cause voltage to be periodically subtracted from Vo as Vi rises.

Figure 6:
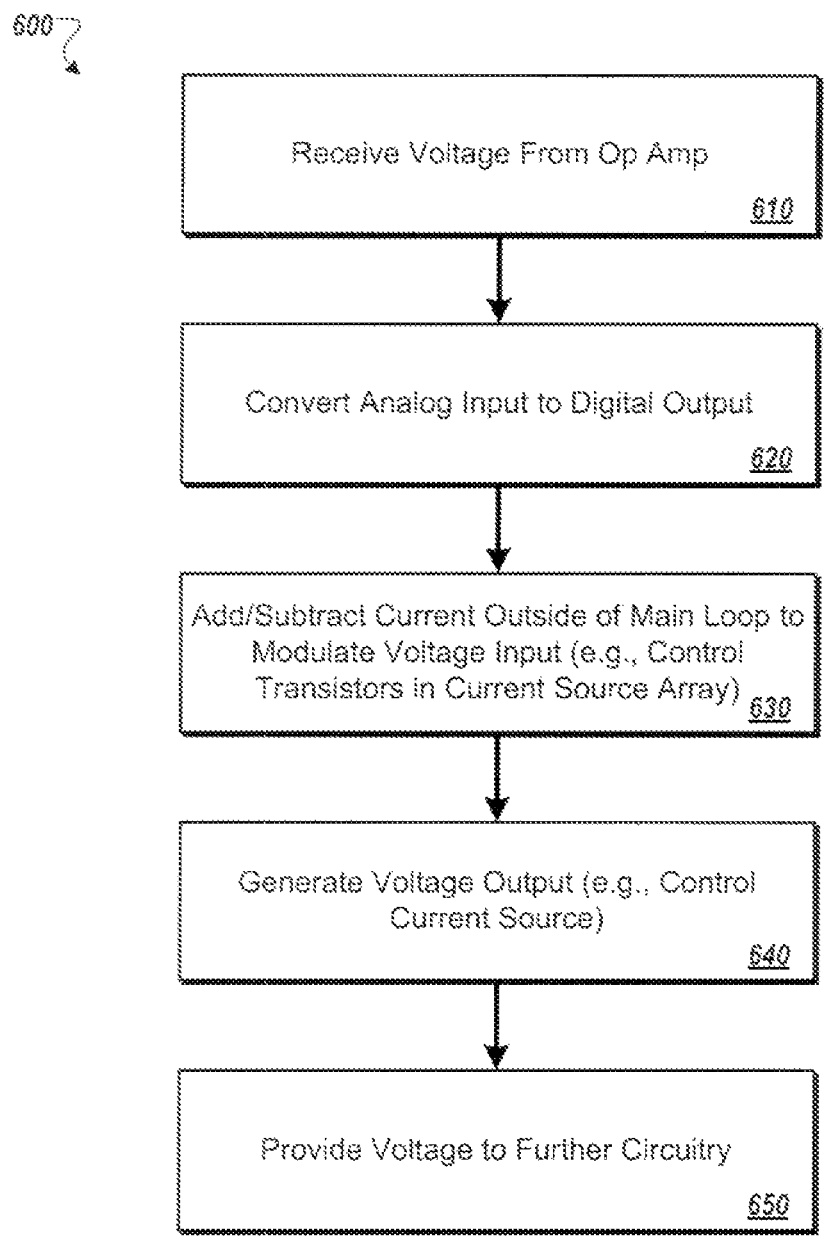
FIG. 6 shows a flowchart of an example of a process for performing low power current-voltage mixed analog to digital conversion.

FIG. 6 shows a flowchart of an example of a process 600 for performing low power current-voltage mixed analog to digital conversion. In some implementations, the process 600 may be implemented by the MADCs 210-240 and 290, or by the circuits 300, 400, or 470.

At 610, a voltage is received from an opamp, the opamp being in a main loop of sample and hold circuitry having an associated analog to digital converter (ADC) module. For example, the opamp 318 provides the input voltage Vin to the current sources 322*a* and 322*b*, the current mirror 324*a* and 324*b*, and the current source arrays 326*a* and 326*b*.

At 620, an analog input provided to the ADC module is converted to a digital output. For example, the outputs of different elements of the comparator array 410 are activated in response to the input voltage Vin to produce a digital output that represents at least a part of the input voltage Vin.

At 630, current is added or subtracted, outside of the main loop, with respect to an output of the main loop to modulate the input voltage from opamp. For example, by controlling transistors in the current source array 326*a*, current can be added or subtracted from the current flowing through the current source 322*a*.

At 640, an output voltage is generated. For example, as current flows through the resistor 330*a*, the output voltage Vo is generated by the current mirror 324*a* coupled with the resistor 330*a*.

At 650, the output voltage is provided to further circuitry. For example, in the circuit 300 the voltage Vo is provided as an input voltage to the subsequent conversion stage's comparator array 390*a*.

Figure 7:
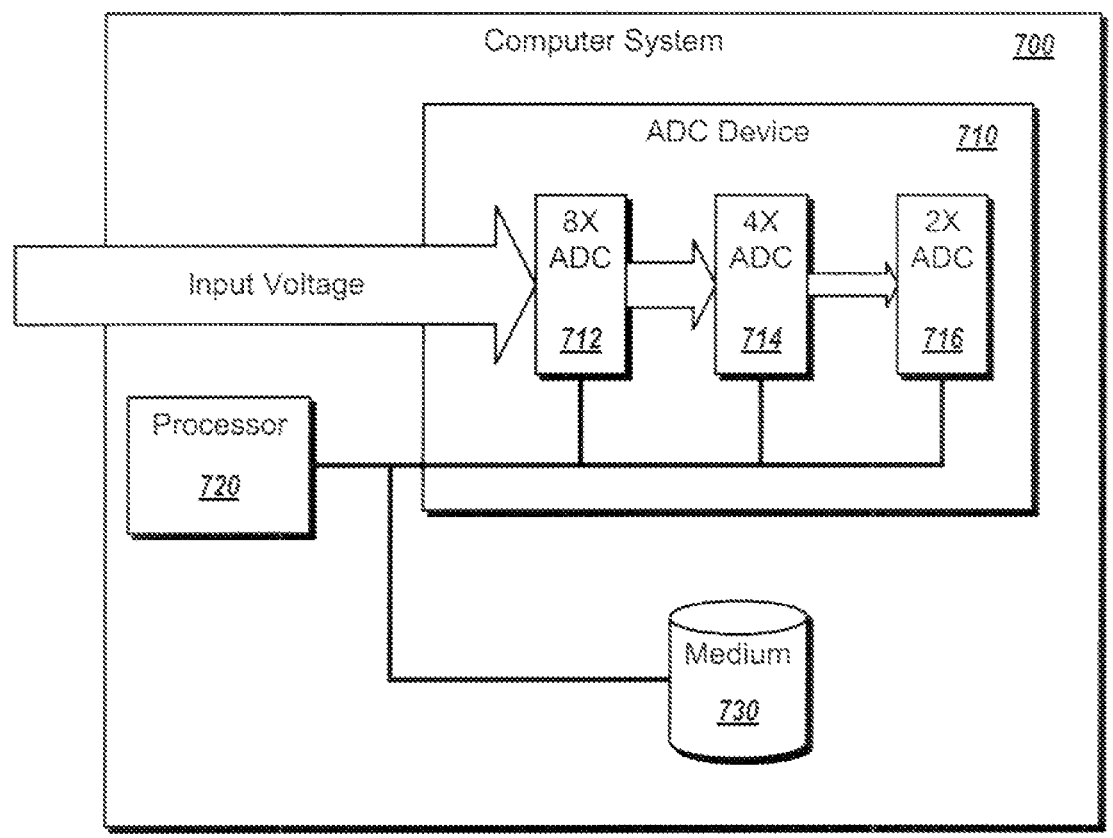
FIG. 7 shows a block diagram of a system that implements a low power current-voltage mixed ADC device.

FIG. 7 shows a block diagram of a computer system 700 that implements an ADC device 710. The computer system 700 includes a processor 720 and a computer readable medium 730 communicatively coupled to the processor 720. In some implementations, the computer readable medium 730 can be a mass storage device (e.g., hard drive, flash drive), a read only memory (ROM), a random access memory (RAM), or other appropriate non-transitory medium for the storage and retrieval of electronic data.

The processor 720 is also communicatively coupled to the ADC device 710. The ADC device 710 has a pipelined architecture, wherein an input voltage is provided to the input of an 8×ADC 712, for example. In some implementations, the number of bits provided by an ADC can be a matter of design choice. For example, various ADCs can be designed to provide any appropriate number of bits of resolution (e.g., one, two, three, four, eight, twenty). The 8×ADC 712 performs a partial analog to digital conversion of the input voltage. The 8×ADC 712 outputs an eight bit digital signal that partly represents the input voltage, and provides that signal to the processor 720 (or another component of the system 700). The 8×ADC 712 also outputs a residual voltage that is supplied to further circuitry, for example, a 4×ADC 714.

The 4×ADC 714 performs a partial analog to digital conversion of the residual voltage, supplies a four bit digital signal that represents the partial conversion to the processor 720 (or another component of the system 700), and outputs a residual voltage to a 2×ADC module 716. The 2×ADC module 716 performs another analog to digital conversion of the residual voltage to produce a two bit digital signal representative of the residual voltage, which is supplied to the processor 720 (or another component of the system 700). The processor 720 (or another component of the system 700) combines the digital signals provided by the ADC modules 712-716 to determine a digital value that represents the input voltage.

Figure 8A:
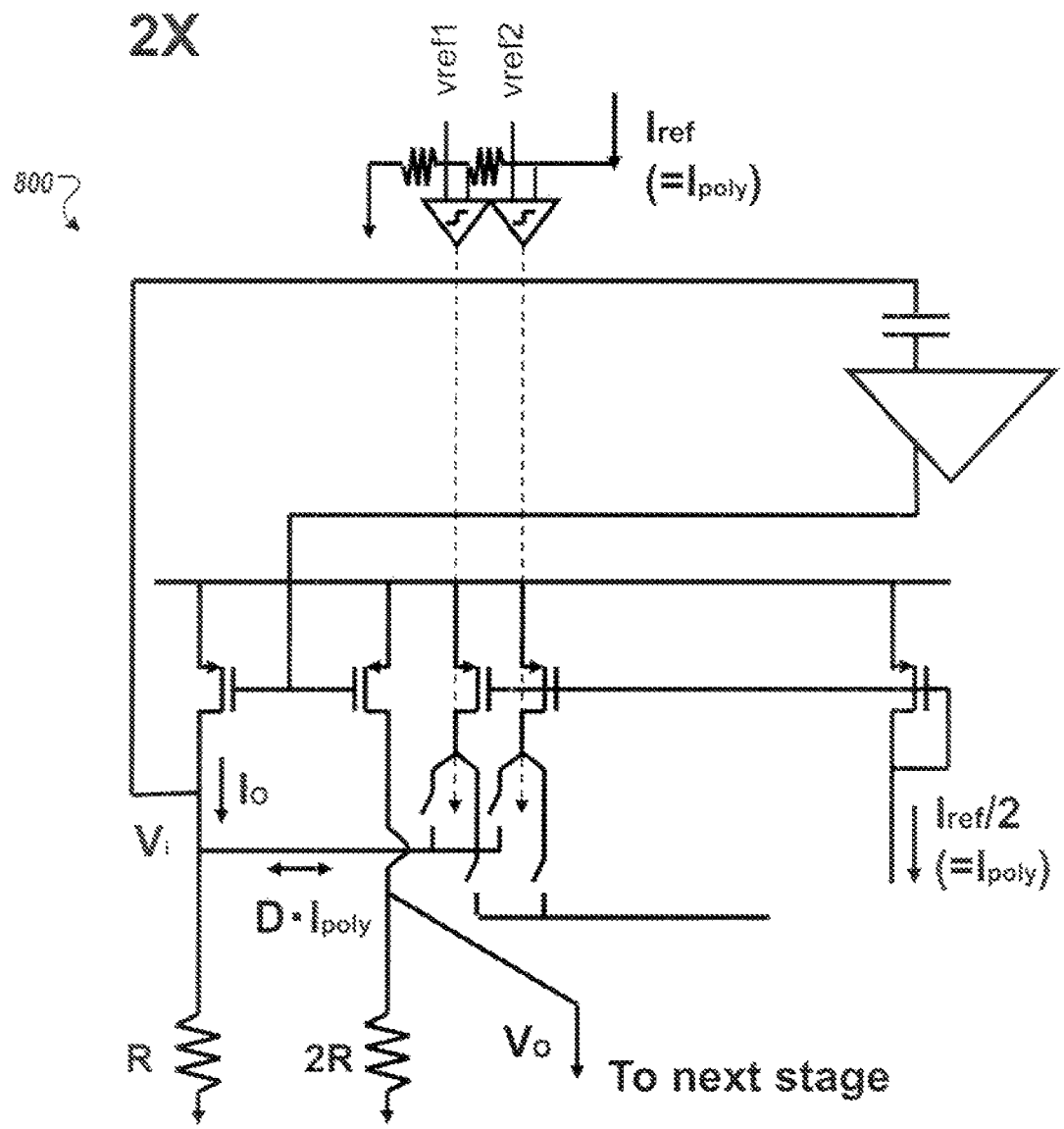
FIGS. 8A-8D show various examples of implementations of the described systems and techniques applied to ×2, ×4 and ×8 gain of MDAC (Multiple Digital to Analog converter) stage of FIG. 2B.
Figure 8B:
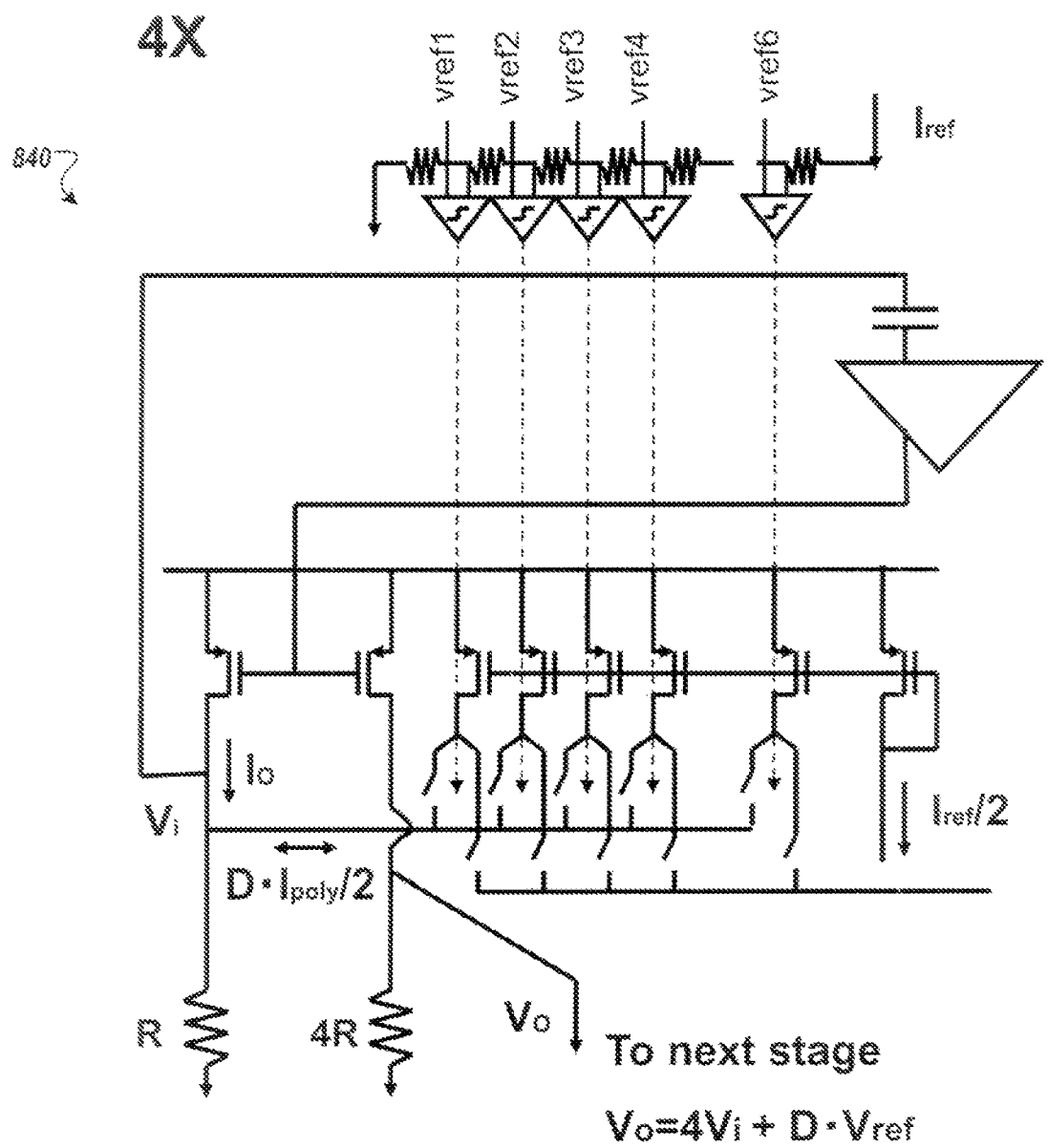

FIGS. 8A-8D show various examples of implementations of the described systems and techniques applied to ×2, ×4 and ×8 gain of the MDAC (Multiple Digital to Analog converter) stage of FIG. 2B. For example, FIG. 8A illustrates a 2× low power current-voltage mixed ADC circuit 800. The circuit 800 accepts an input voltage and outputs a 2-bit digital signal as well as an output voltage. In some implementations, the circuit 800 may be the 2×ADC 716 of FIG. 7. FIG. 8B illustrates a 4× low power current-voltage mixed ADC circuit 840. The circuit 840 accepts an input voltage and outputs a 4-bit digital signal as well as an output voltage. In some implementations, the circuit 840 may be the 4×ADC 714 of FIG. 7.

In some implementations, at least one ADC module can include at least a four bit ADC such as the 4×ADC 714, the sample and hold circuitry can include a feedback capacitor and an operational amplifier, an output line of the operational amplifier can be coupled with the current source, a first side of the feedback capacitor can be coupled with an output line of the current source, a second side of the feedback capacitor can be coupled with an input line of the operational amplifier, and the feedback capacitor can be configured and arranged to receive an analog input directly.

Figure 8C:
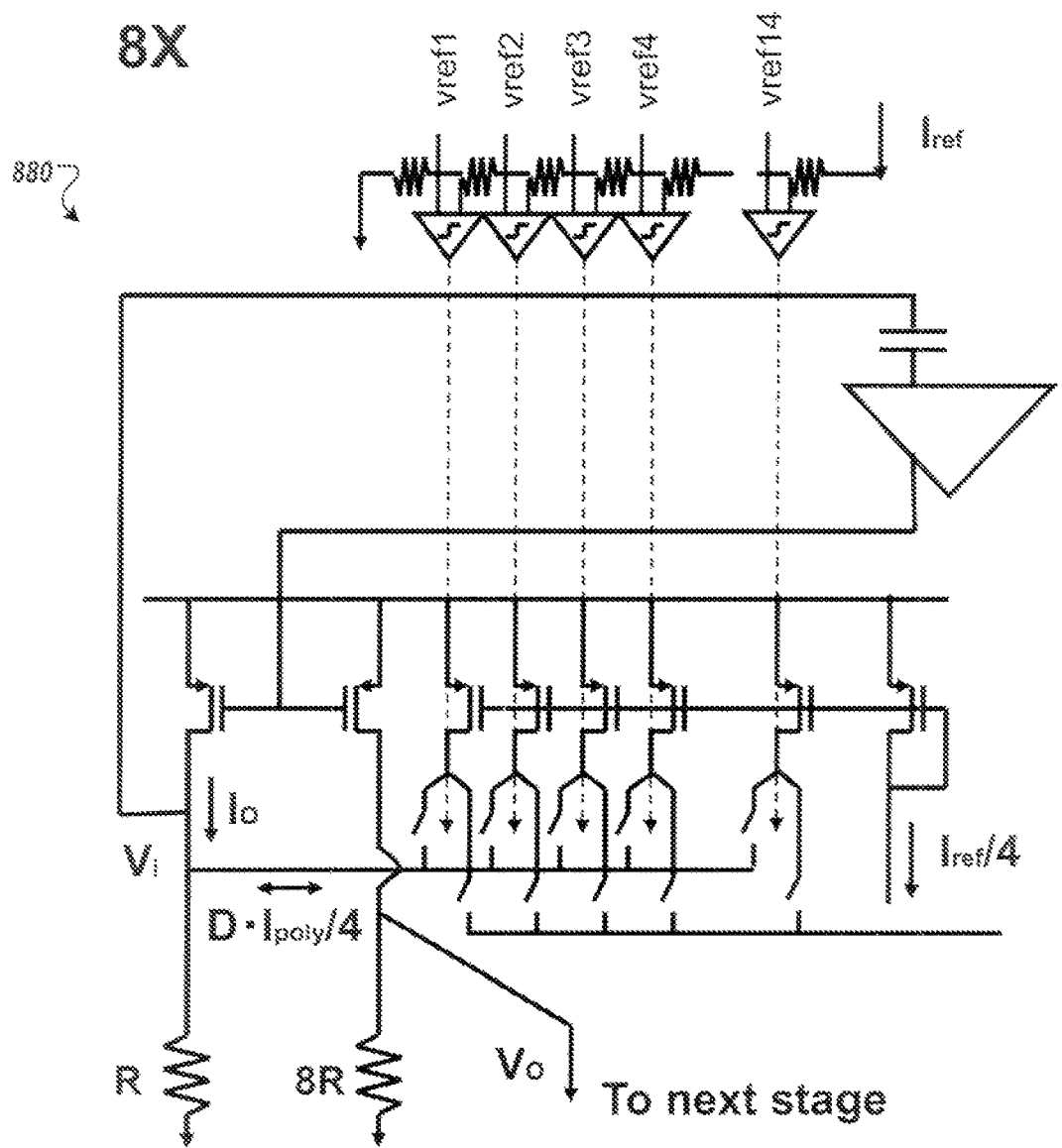
Figure 8D:
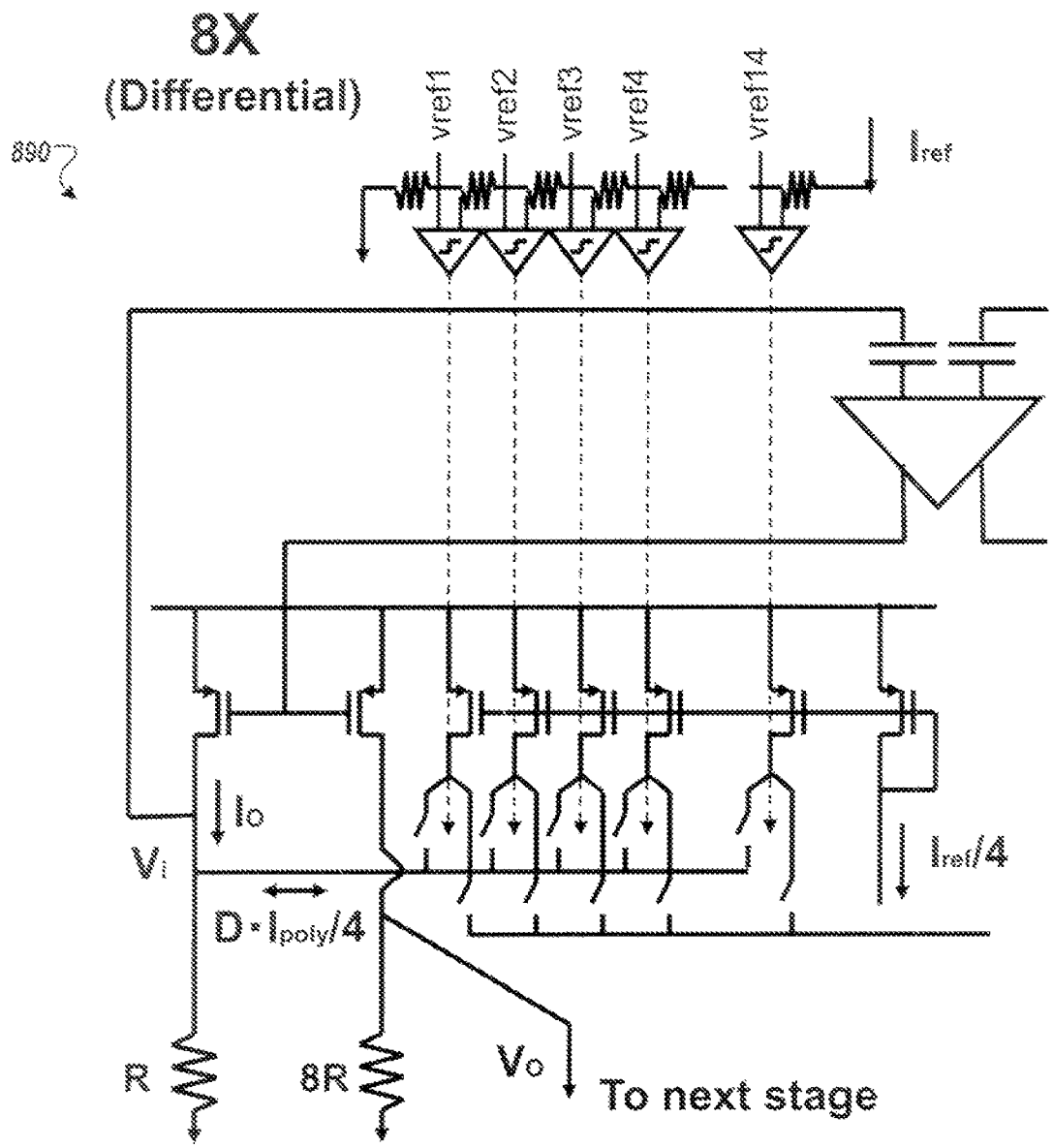

FIG. 8C illustrates an 8× low power current-voltage mixed ADC circuit 880. The circuit 880 accepts an input voltage and outputs an 8-bit digital signal as well as an output voltage. In some implementations, the circuit 880 may be the 8×ADC 712 of FIG. 7. FIG. 8D illustrates an 8× differential low power current-voltage mixed ADC circuit 890. The circuit 890 accepts a differential input voltage and outputs an 8-bit digital signal as well as an output voltage. In some implementations, the circuit 890 may be an example of the circuit 300 of FIG. 3.

FIGS. 9A-9D show example transfer functions produced by various low power current-voltage mixed ADC circuits. Each of the FIGS. 9A-9D shows a line 902, 904, 906, and 908. The line 902 represents a 1-to-1 correlation between input voltage and output voltage. For example, the circuit 400 with no holdings may exhibit an output that follow the line 902. The lines 904, 906, and 908 have slopes that, in some implementations, may be representative of the relationships between output and input voltage for two, four, and eight bit low power current-voltage mixed ADC circuits, as will be explained below.

Figure 9A:
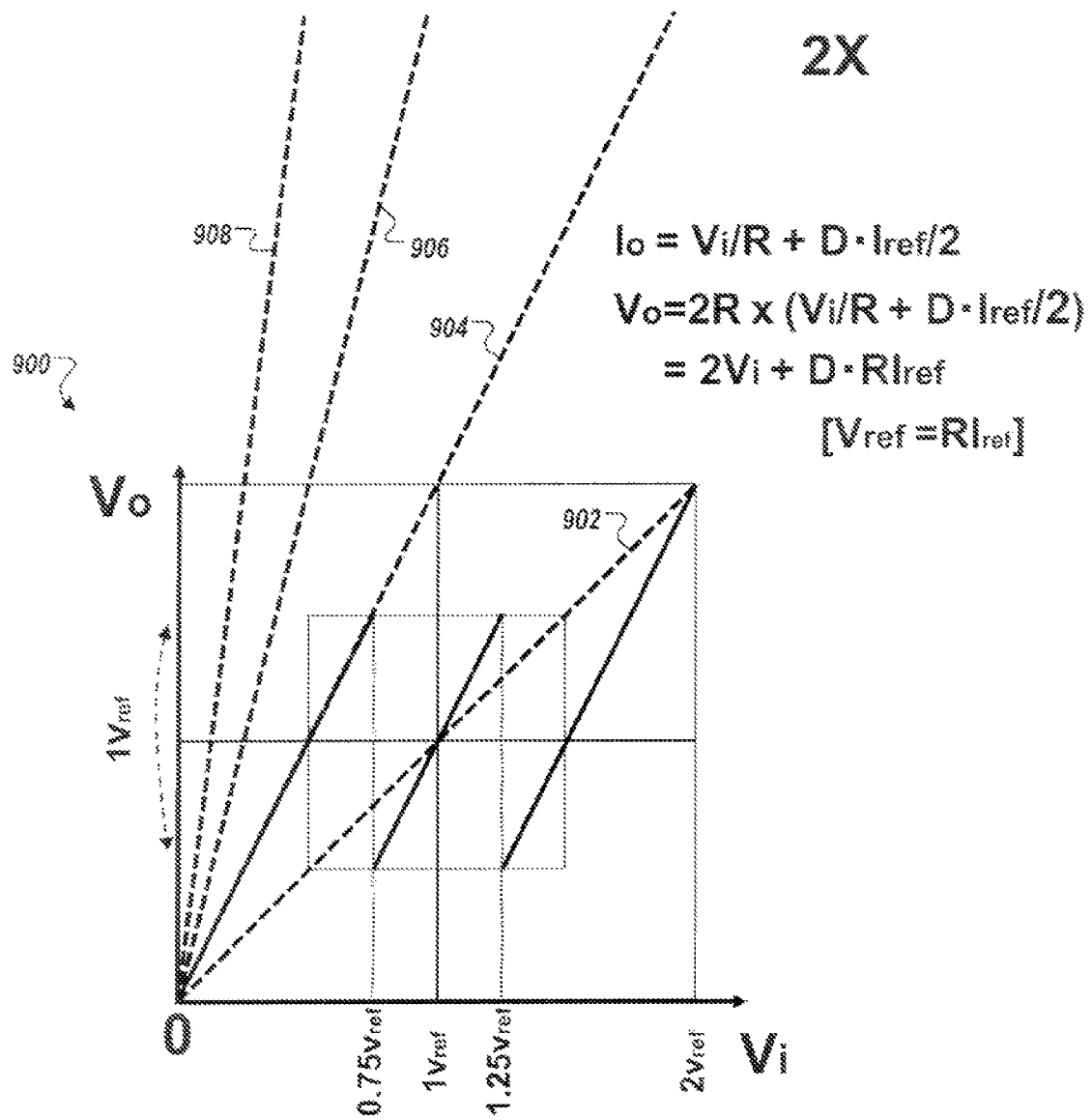
FIGS. 9A-9D show transfer functions produced by various low power current-voltage mixed ADC circuits.

FIG. 9A shows an example of transfer function 900 produced by a 2×ADC circuit, such as the 2×ADC circuit 800 of FIG. 8A. The line 904 has a slope that represents the relationship between the voltage output to voltage input for a 2×ADC circuit. In the present example, output voltage climbs from about 0V at a starting input voltage of about 0V, to an output of approximately 1.5Vref when the input voltage rises to approximately 0.75Vref. At this point, the output voltage drops sharply to an output voltage of approximately 0.5Vref, and begins to climb again as the input voltage rises. The output voltage rises to approximately 1.5Vrev again at an input voltage of approximately 1.25Vref, at which point the output voltage once again drops sharply to an output voltage of approximately 0.5Vref before climbing again.

The pronounced output voltage shifts at input voltages of 0.75Vref and 1.25Vref are the result of current subtraction (e.g., or current addition in other embodiments) performed within the 2×ADC. For example, the comparator array of the circuit 800 may be provided with reference voltages of 0.75Vref and 1.25Vref. As a result, as the sampled input voltage rises, neither of the two comparators' outputs are triggered (e.g., a binary "00") and nether current source is switched in to the output circuit. When the input voltage exceeds 0.75Vref, one of the comparators outputs is activated, providing a digital signal representative of the analog input (e.g., a binary "01") as well as a signal that switches in a corresponding current source. The current provided by the current source causes the output voltage to drop back down to about 0.5Vref. As the input voltage continues to rise above 1.25Vref, the other comparator's output is also triggered (e.g., a binary "11") and the second current source is activated. The current provided by the second current source causes the output voltage to drop back down to about 0.5Vref once again before climbing in response to an increasing input voltage.

Figure 9B:
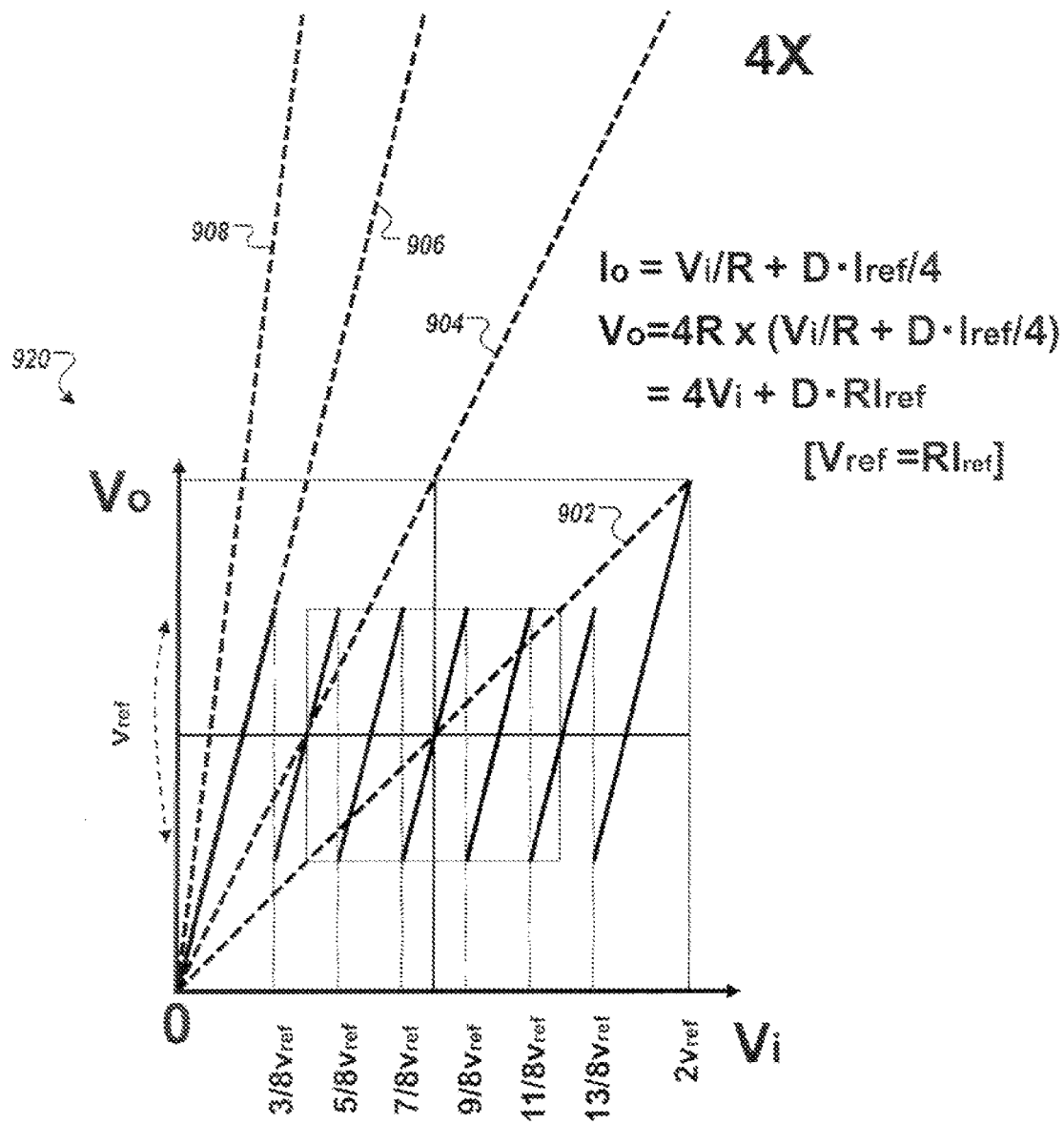

Referring now to FIG. 9B, an example of transfer function 920, produced by a 4×ADC such as the 4×ADC circuit 840 of FIG. 8B, is shown. The line 906 has a slope that represents the relationship between the voltage output to voltage input for a 4×ADC circuit. In the present example, output voltage climbs from 0V at a starting input voltage of 0V, to an output of approximately 1.5Vref when the input voltage rises to approximately 3/8Vref. At this point, the output voltage drops sharply to an output voltage of approximately 1.0Vref, and begins to climb again as the input voltage rises.

In the present example, the pronounced output voltage shifts at various input voltages of approximately 3/8Vref, 5/8Vref, 7/8Vref, 9/8Vref, 11/8Vref, and 13/8Vref, are the result of current subtraction (e.g., or current addition in other embodiments) performed within the 4×ADC. For example, the comparator array of the circuit 840 may be provided with reference voltages of approximately 3/8Vref, 5/8Vref, 7/8Vref, 9/8Vref, 11/8Vref, and 13/8Vref. In some implementations, the six reference voltages contribute a 6 bit thermometer code, which can be converted to binary code, for example, by a thermometer-to-binary decoder. In some implementations, the number of the trip points can be extended to get redundant bit information for each stage. For example, redundant bit information may belt is used for digital corrections technique, which is too detail heresuch as by the digital correction module 260 of FIG. 2A. Theoretically, the number of transitions can be expressed by 2^n.

For an input voltage of zero, none of the comparators outputs are active to produce a digital output (e.g., a binary "000000"); nor are any current sources switched in to alter the output voltage. As the input voltage rises above the various reference voltages provided to the comparator array of the circuit 840, the comparators' outputs are activated to produce various corresponding digital signals that can both represent the input voltage level as well as switch in current sources that can cause the output voltage to be shifted higher or lower. For example, as the input voltage exceeds 9/8Vref, the first four comparators outputs are triggered, thereby producing a digital signal of "001111".

Figure 9C:
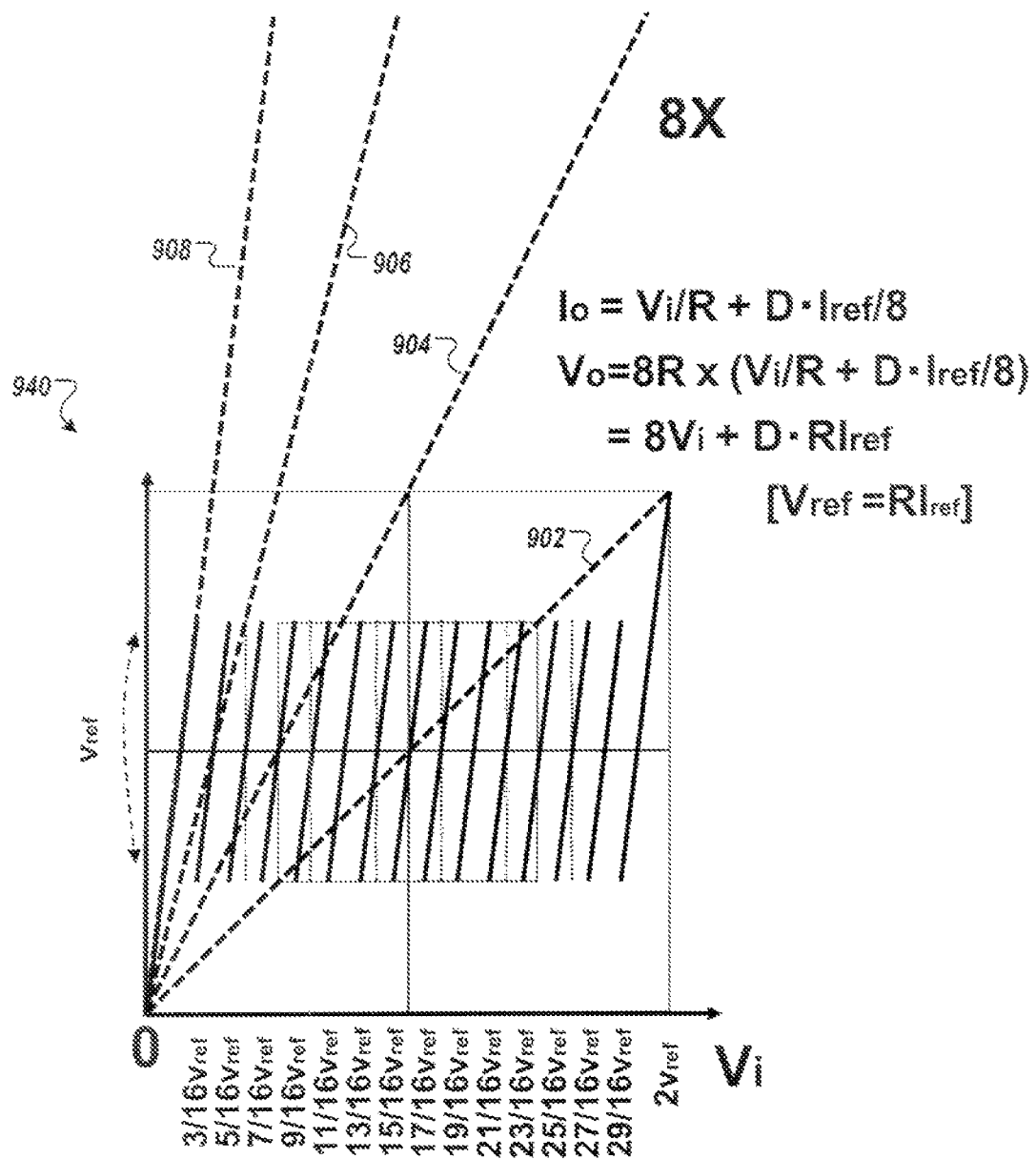

Referring now to FIG. 9C, an example of transfer function 940, produced by a 8×ADC such as the 8×ADC circuit 880 of FIG. 8C, is shown. The line 908 has a slope that represents the relationship between the voltage output to voltage input for an 8×ADC circuit. In the present example, output voltage climbs from 0V at a starting input voltage of 0V, to an output of approximately 1.5Vref when the input voltage rises to approximately 3/16Vref. At this point, the output voltage drops sharply to an output voltage of approximately 0.5Vref, and begins to climb again as the input voltage rises.

Figure 9D:
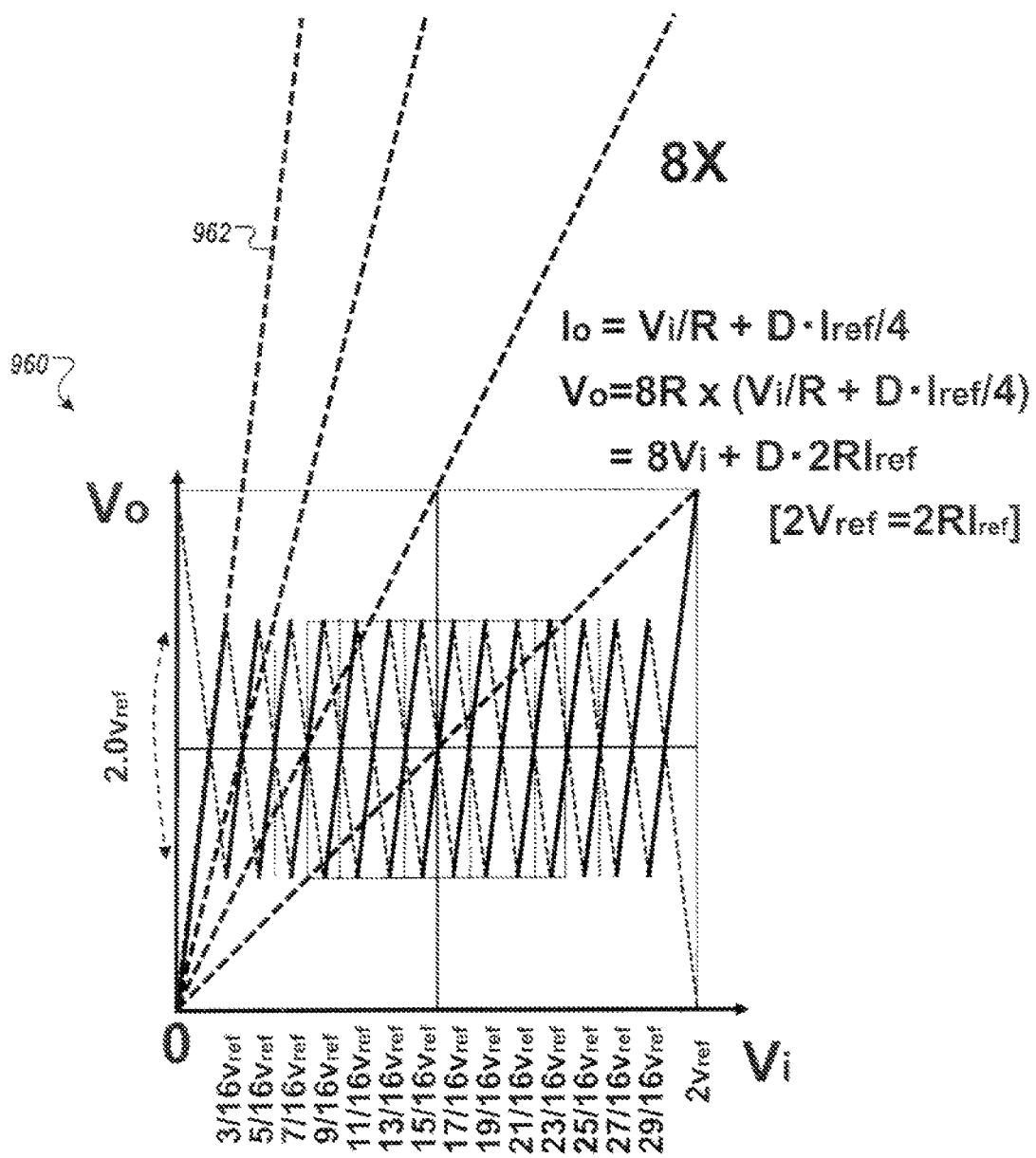

Referring now to FIG. 9D, an example of transfer function 960, produced by a differential 8×ADC such as the differential 8×ADC circuit 890 of FIG. 8D, is shown. The line 962 has a slope that represents the relationship between the voltage output to voltage input for a differential 8×ADC circuit with no holdings. In such a differential circuit, a pair of differential output signals is output in response to a pair of differential input signals. A line 964 represents the transfer function of output signal of the differential pair, while a line 966 represents the transfer function of the other output of the pair. In the present example, one output voltage climbs from 0V at a starting input voltage of 0V, to an output of approximately 1.5Vref when the input voltage rises to approximately 3/16Vref. The other output starts at output voltage of approximately 2Vref at a starting input voltage of 0V, and drops to approximately 0.5Vref when the input voltage rises to approximately 3/16Vref. At this point, the first output voltage drops sharply to an output voltage of approximately 0.5Vref, and begins to climb again as the input voltage rises. The second output voltage rises sharply to an output voltage of approximately 1.5Vref, and begins to decrease again as the input voltage rises.

Figure 10:
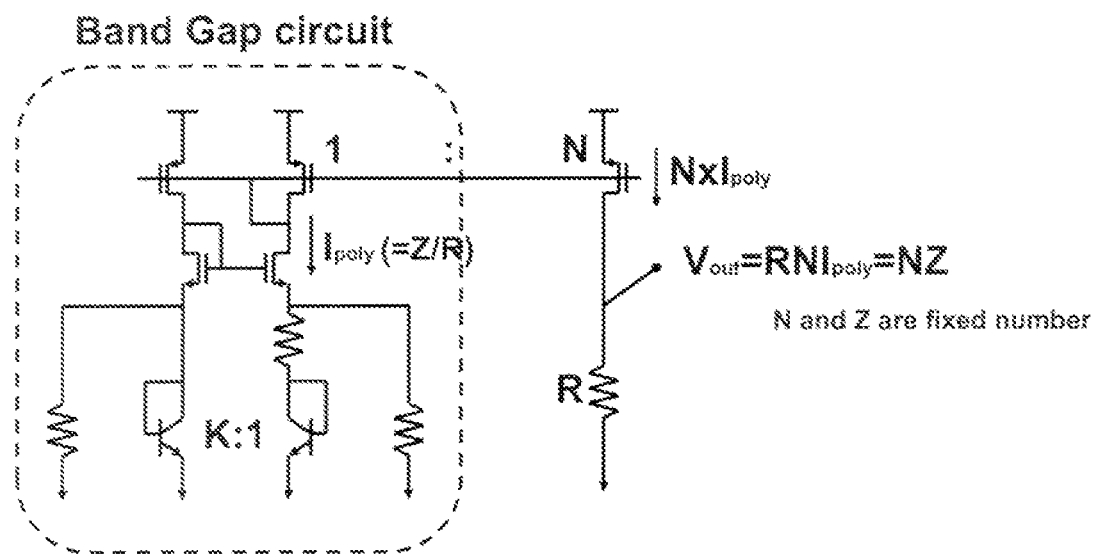
FIG. 10 shows a schematic of an example of a band gap circuit to provide reference current and voltage for MDAC.

FIG. 10 shows a schematic of an example of a band gap circuit 1000, which provides additional information regarding the poly current, Ipoly, referenced in FIGS. 8A-8D. Ipoly is a product of R and Z (device constant), so Vout is substantially independent of process variation. Therefore, Vout is a substantially constant voltage. In some implementations, the current N×Ipoly can be used as reference current of Iref/2, Iref/4, or Iref/8 generation depending on the gain slope of the MDAC.

A few embodiments have been described in detail above, and various modifications are possible. The disclosed subject matter, including the functional operations described in this specification, can be implemented in electronic-circuitry, computer hardware, firmware, software, or in combinations of them, such as the structural means disclosed in this specification and structural equivalents thereof, including potentially a program (e.g., an electronic circuit emulation program) operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand-alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but, rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. An analog to digital converter (ADC) device comprising:
    sample and hold circuitry comprising a feedback capacitor and an operational amplifier;
    at least one ADC module configured to generate a first digital output based on a first analog input provided to the sample and hold circuitry; and
    current generation circuitry configured to modulate an analog output of the sample and hold circuitry to generate a residue output corresponding to the first analog input absent at least a portion corresponding to the first digital output, and to provide the residue output as a second analog input to further circuitry to generate a second digital output;
    wherein an output line of the operational amplifier is coupled with the current generation circuitry, a first side of the feedback capacitor is coupled with an output line of the current generation circuitry, a second side of the feedback capacitor is coupled with an input line of the operational amplifier, and the feedback capacitor is configured and arranged to receive the first analog input directly.

2. The ADC device of claim 1, wherein the further circuitry comprises the sample and hold circuitry.

3. The ADC device of claim 1, comprising:
    multiple discrete stages, including a first stage and a second stage, the first stage comprising the sample and hold circuitry, and the second stage comprising the further circuitry.

4. The ADC device of claim 1, wherein the current generation circuitry comprises:
    a current source;
    a current mirror coupled with the current source; and
    a current source array coupled in parallel with the current source or the current mirror.

5. The ADC device of claim 4, wherein the at least one ADC module comprises a flash ADC, and the current source array comprises transistors coupled with and responsive to one or more output lines of the flash ADC.

6. The ADC device of claim 4, wherein the current source array comprises multiple Metal Oxide Semiconductor (MOS) transistors.

7. The ADC device of claim 4, wherein the first analog input and the second analog input are each differential input signals.

8. The ADC device of claim 4, wherein the at least one ADC module comprises at least a four bit ADC, the output line of the operational amplifier is coupled with the current source, and the first side of the feedback capacitor is coupled with an output line of the current source.

9. The ADC device of claim 8, wherein the ADC device is coupled with a system comprising:
    processor electronics; and
    a computer readable medium coupled with the processor electronics.

10. The ADC device of claim 9, wherein the ADC device comprises a pipelined ADC device.

11. The ADC device of claim 10, wherein the pipelined ADC device comprises multiple discrete stages, including a first stage and a second stage, the first stage comprising the sample and hold circuitry, and the second stage comprising the further circuitry.

12. The ADC device of claim 11, wherein the multiple discrete stages include a third stage, the first stage is configured to generate eight bits of digital output, the second stage is configured to generate four bits of digital output, and the third stage is configured to generate two bits of digital output.

13. A method comprising:
    receiving a voltage input from an operational amplifier, the operational amplifier being in a main loop comprising sample and hold circuitry and an associated analog to digital converter (ADC) module;
    adding or subtracting, outside of the main loop, current with respect to an output of the main loop to modulate the voltage input from the operational amplifier, in accordance with a residue function, to generate a voltage output; and
    providing the voltage output to further circuitry to generate a digital output corresponding to the voltage output;
    wherein the sample and hold circuitry comprises a feedback capacitor, the output of the main loop is coupled with current generation circuitry to affect the adding or subtracting, a first side of the feedback capacitor is coupled with an output line of the current generation circuitry, and a second side of the feedback capacitor is coupled with an input line of the operational amplifier.

14. The method of claim 13, comprising:
    converting an analog input provided to the ADC module into a digital output;
    controlling a current source using the output of the main loop, the current source being coupled with a current mirror configured to generate the voltage output; and
    controlling transistors in a current source array in accordance with the digital output to effect the adding or subtracting, the current source array being coupled in parallel with the current source.

15. The method of claim 14, wherein the ADC module comprises a flash ADC, and the current source array comprises transistors coupled with and responsive to one or more output lines of the flash ADC.

16. The method of claim 13, comprising:
    converting an analog input provided to the ADC module into a digital output;

controlling a current source using the output of the main loop, the current source being coupled with a current mirror configured to generate the voltage output; and controlling transistors in a current source array in accordance with the digital output to effect the adding or subtracting, the current source array being coupled in parallel with the current mirror.

17. The method of claim 16, wherein the ADC module comprises a flash ADC, and the current source array comprises transistors coupled with and responsive to one or more output lines of the flash ADC.

18. The method of claim 13, wherein the further circuitry comprises the sample and hold circuitry.

19. The method of claim 13, wherein the ADC module comprises multiple discrete stages, including a first stage and a second stage, the first stage comprising the sample and hold circuitry, and the second stage comprising the further circuitry.

20. The method of claim 19, wherein the ADC module receives differential input signals.

* * * * *